US008872518B2

(12) United States Patent
Liu et al.

(10) Patent No.: US 8,872,518 B2
(45) Date of Patent: Oct. 28, 2014

(54) DETERMINING THE STATE OF-CHARGE OF BATTERIES VIA SELECTIVE SAMPLING OF EXTRAPOLATED OPEN CIRCUIT VOLTAGE

(75) Inventors: Albert Shih-Young Liu, Redwood City, CA (US); Li-Wei Chen, Redwood City, CA (US)

(73) Assignee: ATIEVA, Inc., Redwood City, CA (US)

( * ) Notice: Subject to any disclaimer, the term of this patent is extended or adjusted under 35 U.S.C. 154(b) by 1161 days.

(21) Appl. No.: 12/823,268

(22) Filed: Jun. 25, 2010

(65) Prior Publication Data

US 2011/0316547 A1  Dec. 29, 2011

(51) Int. Cl.
*G01R 31/36* (2006.01)

(52) U.S. Cl.
CPC .......... *G01R 31/362* (2013.01); *G01R 31/3651* (2013.01); *G01R 31/3624* (2013.01)
USPC .............................. 324/427; 702/63; 320/132

(58) Field of Classification Search
USPC .......................................................... 324/427
See application file for complete search history.

(56) References Cited

U.S. PATENT DOCUMENTS

| | | | |
|---|---|---|---|
| 5,321,627 A * | 6/1994 | Reher | 702/63 |
| 5,631,540 A | 5/1997 | Nguyen | |
| 5,764,027 A | 6/1998 | Harvey | |
| 5,798,934 A * | 8/1998 | Saigo et al. | 702/63 |
| 6,157,165 A | 12/2000 | Kinoshita et al. | |
| 6,163,135 A | 12/2000 | Nakayama et al. | |
| 6,307,351 B1 | 10/2001 | Yokoyama | |
| 6,356,083 B1 | 3/2002 | Ying | |
| 6,388,447 B1 * | 5/2002 | Hall et al. | 324/426 |
| 6,441,586 B1 | 8/2002 | Tate, Jr. et al. | |
| 6,531,874 B2 | 3/2003 | Mentgen et al. | |
| 6,534,954 B1 | 3/2003 | Plett | |
| 6,573,687 B2 | 6/2003 | Kimura et al. | |
| 6,621,250 B1 | 9/2003 | Ohkubo et al. | |
| 6,639,385 B2 | 10/2003 | Verbrugge et al. | |
| 6,762,590 B2 | 7/2004 | Yudahira | |
| 6,845,332 B2 | 1/2005 | Teruo | |
| 6,882,129 B2 | 4/2005 | Boskovitch et al. | |
| 7,061,246 B2 | 6/2006 | Dougherty et al. | |
| 7,173,396 B2 | 2/2007 | Gunji | |
| 7,193,391 B2 | 3/2007 | Moore | |
| 7,508,170 B2 | 3/2009 | IIda et al. | |
| 7,528,575 B2 | 5/2009 | Murakami et al. | |
| 7,570,024 B2 | 8/2009 | Melichar | |
| 7,602,145 B2 | 10/2009 | Renda | |
| 7,649,338 B2 * | 1/2010 | Seo et al. | 320/132 |
| 7,675,291 B2 * | 3/2010 | Matsuo et al. | 324/426 |
| 7,679,327 B2 * | 3/2010 | Kim et al. | 320/132 |

(Continued)

FOREIGN PATENT DOCUMENTS

| | | |
|---|---|---|
| WO | 2005/085889 | 9/2005 |
| WO | 2008/053410 | 5/2008 |

*Primary Examiner* — Samuel Berhanu
*Assistant Examiner* — Jerry D Robbins
(74) *Attorney, Agent, or Firm* — Womble, Carlyle, Sandridge & Rice

(57) ABSTRACT

A method for estimating the state-of-charge of a battery. The method includes collecting a plurality of voltage measurements during operation of the system containing the battery and determining a time-constant of relaxation and an open-circuit voltage corresponding to the battery based, at least in part, on the voltage measurements. The method further includes estimating the state-of-charge of the battery based, at least in part, on the open-circuit voltage.

20 Claims, 7 Drawing Sheets

(56) References Cited

U.S. PATENT DOCUMENTS

| | | | |
|---|---|---|---|
| 7,679,329 B2* | 3/2010 | Lim et al. | 320/132 |
| 2003/0107352 A1 | 6/2003 | Downer et al. | |
| 2009/0256524 A1* | 10/2009 | Nukui | 320/132 |
| 2009/0326842 A1 | 12/2009 | Thomas-Alyea | |
| 2010/0106437 A1* | 4/2010 | Aboshi et al. | 702/63 |
| 2010/0134073 A1 | 6/2010 | Kohn | |
| 2010/0138178 A1 | 6/2010 | Paryani et al. | |
| 2010/0153038 A1 | 6/2010 | Tomura et al. | |

* cited by examiner

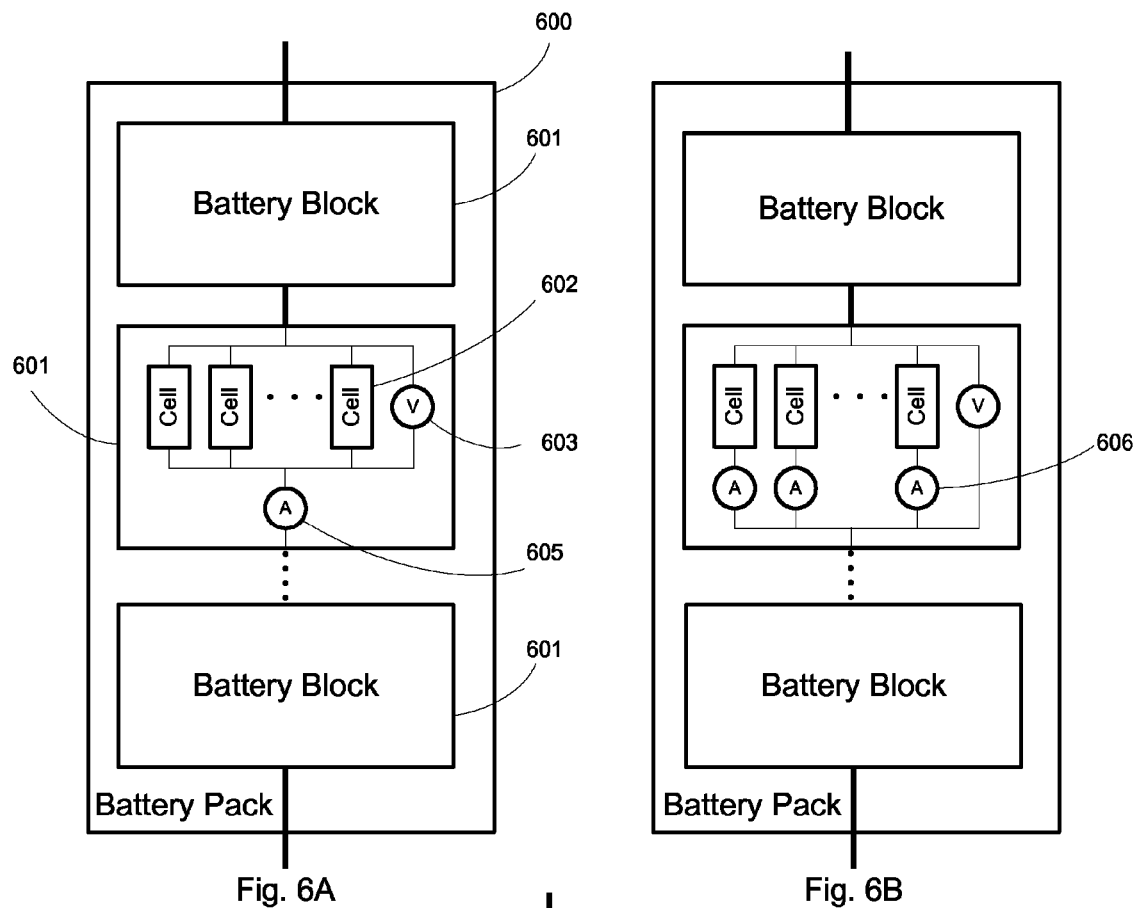
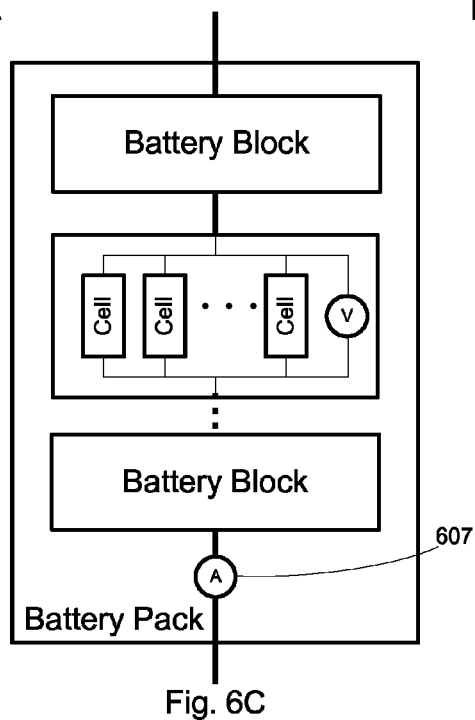
Fig. 6A  Fig. 6B  Fig. 6C

DETERMINING THE STATE OF-CHARGE OF BATTERIES VIA SELECTIVE SAMPLING OF EXTRAPOLATED OPEN CIRCUIT VOLTAGE

FIELD OF THE INVENTION

The present invention relates to battery systems.

BACKGROUND

Batteries have been used in automotive and industrial applications for many years. Accurate estimation of the amount of energy in a battery (hereinafter referred to as the state-of-charge or SOC) is very useful. It allows a battery management system to maximize battery performance, reliability and lifetime. It also allows for more accurate range and power output prediction for electric or hybrid vehicles.

Existing techniques for determining SOC often use the battery open-circuit voltage (OCV) to estimate SOC, using a table of previously determined values that relate OCV to SOC. One limitation of this approach is that OCV is normally measured when the battery is in a "relaxed state", meaning that the measured voltage across the battery terminals has stopped changing after the current flow has stopped. Depending on various operational parameters, reaching a relaxed state can take a considerable period of time. Techniques for predicting OCV from measured voltages have been proposed that use the following formula:

$$V(t) = OCV - \alpha e^{-t/\tau}$$

where $V(t)$ is a voltage measurement taken at time $t$, $\alpha$ is the overpotential and $\tau$ is the time constant. These techniques use a pre-characterized value for $\tau$ and statistical mathematical techniques to obtain $\alpha$ and OCV from a set of voltages measurements taken over an idle period in which negligible power is drawn from the battery. Thus a value for OCV, and hence SOC, is obtained without waiting until the battery is fully in a "relaxed state" and the measured battery voltages have stabilized. Unfortunately, the foregoing approach may still yield inaccurate values of OCV and also may require excessive idle periods in which to collect voltage measurements.

BRIEF DESCRIPTION OF THE DRAWINGS

The present invention is illustrated by way of example, and not limitation, in the figures of the accompanying drawings and in which like reference numerals refer to similar elements and in which:

FIGS. 6A, 6B and 6C illustrate embodiments of a battery pack with voltage and amperage sensors.

DETAILED DESCRIPTION

In various embodiments disclosed herein, a time-constant of relaxation for a battery is dynamically updated during operation of the system in which the battery is installed, thereby yielding potentially more accurate estimation of battery state-of-charge (SOC) and/or reduced measurement collection interval than achieved through prior-art techniques. The more accurate SOC estimation and/or reduced measurement collection interval may be particularly advantageous in an electric/hybrid vehicle, providing for example, increased battery life, reliability and safety and increased vehicle range and power output estimation. Moreover, because the time-constant of relaxation is determined as part of system operation, the substantial effort (and data storage) otherwise required to pre-characterize (e.g., tabulate) the time-constant of relaxation across potentially numerous battery chemistries and/or operating conditions may be avoided.

In one embodiment, for example, regression analysis is used to determine OCV, $\alpha$ and $\tau$ in the formula $V(t) = OCV - \alpha e^{-t/\tau}$ from a sequence of electrical measurements taken over time during operation of the system. Operation of the system refers, for example, to an end-user of the system employing the system for its intended purpose, and thus may be distinguished from data collection during manufacturing or production of the system. In the case of an electric or hybrid-electric vehicle, for example, battery voltage measurements may be collected while a driver (or pilot) drives the vehicle from one point to another so that power may potentially be drawn from the battery during measurement collection interval. Moreover, measurement collection may be triggered with or without the end-user's knowledge or input. For example, voltage measurement collection may be triggered by powering on the system (i.e., measurements collected periodically or occasionally so long as the system is "on"), and/or by events that occur during operation of the vehicle (e.g., detecting that a moving vehicle as at rest, that braking is occurring, etc.). Alternatively, the system may prompt the user to take actions to enable collection of data likely to be valid for purposes of determining the state of charge (e.g., prompting a vehicle operator to coast, remain at rest or stop the vehicle, even as the vehicle is being driven to a destination).

Figure 1:
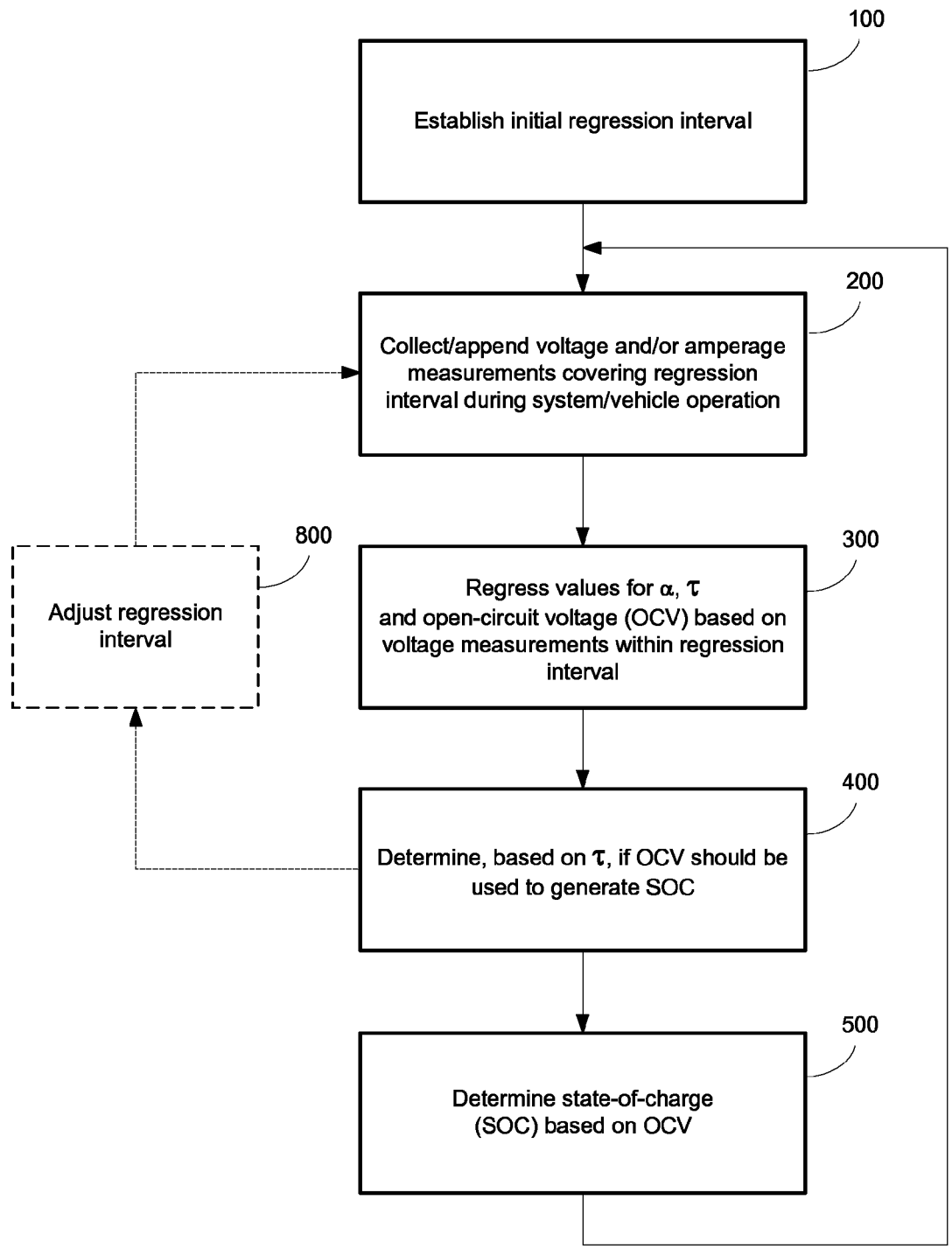
FIG. 1 illustrates an exemplary sequence of operations for determining the SOC.
Figure 3:
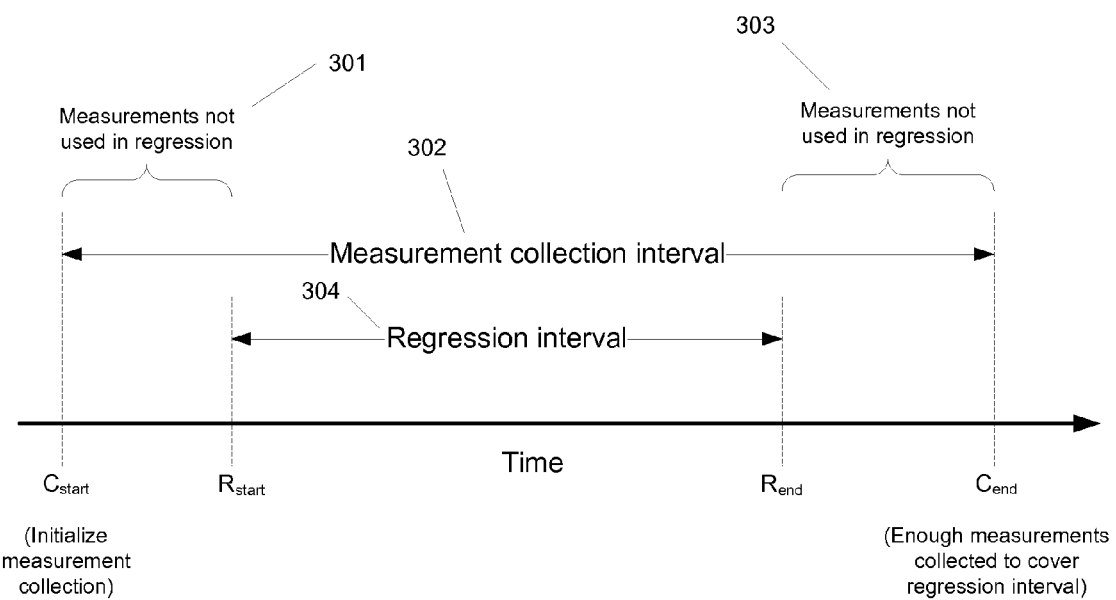
FIG. 3 illustrates the relationship between the collection interval and the regression interval.

FIG. 1 illustrates an exemplary sequence of operations used to determine the SOC of a battery. The sequence begins at 100 by establishing an initial value for the regression interval, relative to the interval of collected electrical measurements, over which the regression analysis will be performed. FIG. 3 shows one embodiment of the relationship between the measurement collection interval 302 and the regression interval 304. In some embodiments it may be useful to not utilize some of the measurements taken during the collection interval as part of the regression analysis. Measurements taken at the beginning 301 and/or end 303 of the measurement collection interval, and/or some specific measurements at other times, may be ignored during the regression analysis to improve the accuracy of the estimation (or prediction) of OCV or $\tau$. In some embodiments $C_{start}$ may equal $R_{start}$ and/or $R_{end}$ may equal $C_{end}$.

Referring again to FIG. 1, the sequence continues in 200, where voltage and/or amperage measurements are collected that are sufficient to perform regression analysis to determine values for OCV and $\tau$. Regression analysis is then performed at 300 to obtain values for OCV, $\alpha$ and $\tau$ using the measurements obtained in 200. Various methods for performing regression analysis could be used. In one embodiment, the Levenberg-Marquardt algorithm is used to obtain OCV, $\alpha$ and $\tau$, but other techniques could also be used. The sequence continues with 400, where the obtained value for OCV is evaluated for accuracy. If accurate enough, the value may then be used to obtain an estimate of SOC in 500. If not, the value may be discarded and not used. In either case, the regression interval may optionally be adjusted in 800 to improve the accuracy of the prediction of OCV and thus SOC and/or to reduce the time taken to obtain an accurate value of SOC. When a value for SOC has been obtained the sequence loops back to 200 to calculate another value of SOC at a later point in time.

FIGS. 6A, 6B and 6C illustrate three different embodiments of battery configurations for which the SOC may be obtained. In these examples, a battery pack 600 is comprised of a plurality of battery blocks 601 connected in series, each of which is comprised of a plurality of battery cells 602 connected in parallel. FIG. 6A shows an embodiment that has one voltage sensor 603 and amperage sensor 605 per battery block. Other embodiments may measure amperage per individual battery cell as in FIG. 6B or voltage per battery block and amperage per battery pack as shown in FIG. 6C. Other battery configurations, including, but not limited to, a single battery cell with a single voltage and amperage sensor, or more complex combinations of cells and sensors, may also utilize the techniques described herein to determine the SOC.

Figure 2:
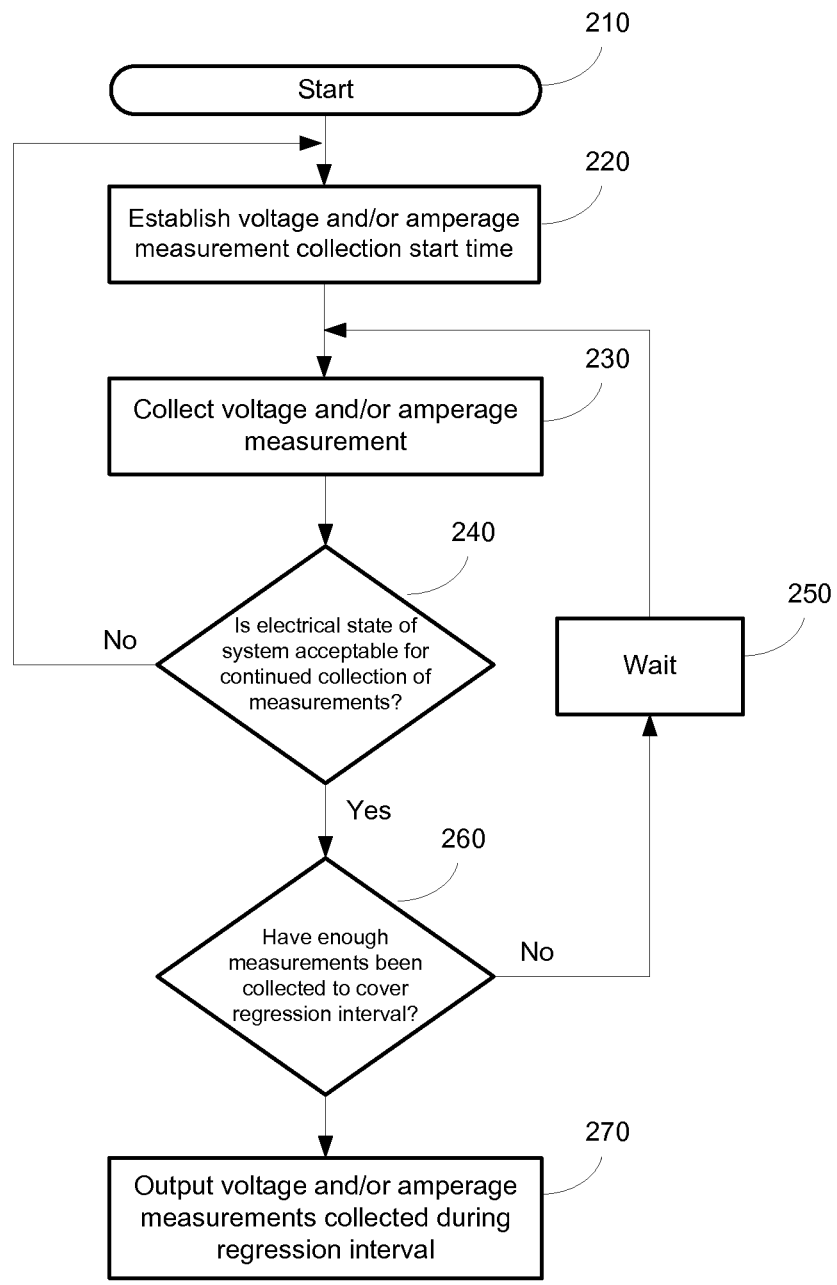
FIG. 2 illustrates an exemplary sequence of operations for collecting voltage and/or amperage measurements during system/vehicle operation.

FIG. 2 illustrates a more detailed view of the collection of voltage and/or amperage measurements in 200 from FIG. 1. The measurement collection start time is established in 220. This begins the measurement collection interval illustrated in FIG. 3 and associates a specific time with $C_{start}$. In some embodiments, the measurements taken prior to $C_{start}$ may be ignored or discarded; in other embodiments they may be used or stored for later use. Next, in 230, the time is recorded and a measurement is taken of the voltage and/or amperage at various physical points in the battery pack. Next in 240 the current electrical state of the system is evaluated to determine if it is acceptable for continued collection of measurements. In one embodiment, this evaluation is based upon the level of current being drawn from the battery by the system as measured by the amperage sensors. If the current is above some threshold, then the battery is considered to not be "relaxing" and the voltage measurements do not represent points on $V(t)=OCV-\alpha e^{-t/\tau}$ and must therefore not be used for the purpose of regression analysis. In this case the process loops back to 220 and establishes the measurement collection start time again, as described above. If, however, the system continues to be in an acceptable electrical state, then the number of measurements and the measurement collection time interval are considered to determine if they are sufficient to allow successful regression analysis of OCV, $\alpha$ and $\tau$. In one embodiment this determination may be made based on the whether the time interval of collected measurements starts before and ends after the required time interval for regression analysis, i.e. the measurement collection interval is a superset of the regression interval. Referring again to FIG. 3, $C_{start}$ would be the same as or before $R_{start}$ and $C_{end}$ would be the same as or after $R_{end}$. Other embodiments may have other tests, including evaluation of the number of measurements within the regression interval or other factors. If the amount and interval of electrical measurements are acceptable, then the regression analysis is performed using those measurements collected during the regression interval. If not, then the process loops back to collect more data, waiting in 250 some period of time before looping back to 230. Some embodiments may keep the wait period constant; others may vary the wait period between different measurement collection intervals (and regression analyses); and furthermore other embodiments may vary the wait period within a collection interval to improve accuracy and/or reduce the time taken to achieve a result.

Figure 4:
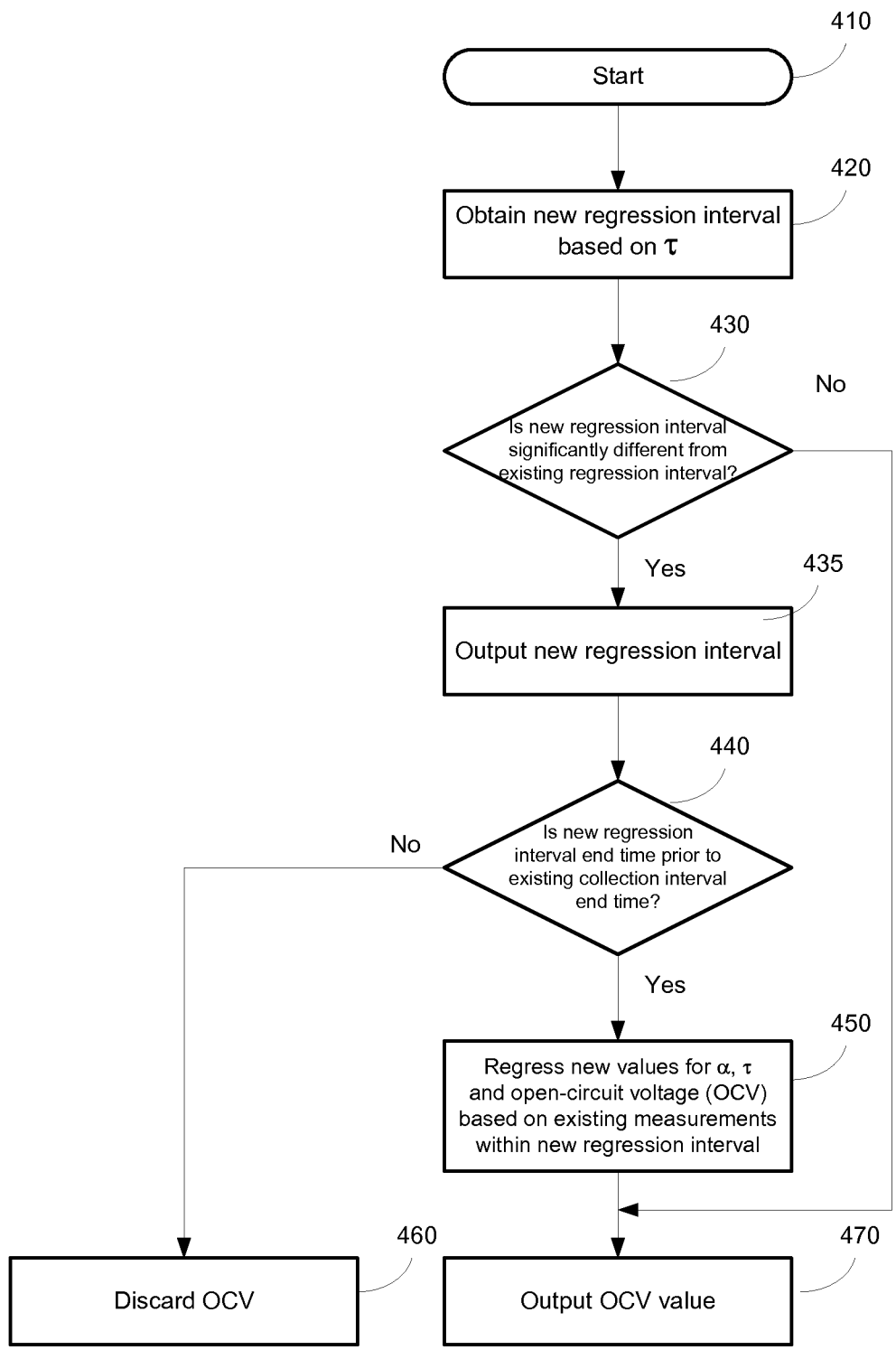
FIG. 4 illustrates an exemplary sequence of operations to assess the accuracy of OCV.

FIG. 4 provides a more detailed view of the process shown in 400 in FIG. 1. In 420 a new regression interval, which includes both a start and end time relative to the start of measurement collection, is determined using the value of $\tau$ obtained from 300 in FIG. 1. One embodiment may determine the new regression interval using a look-up table based on $\tau$; other embodiments may use more complex functions or processes. Next, in 430, this new regression interval is compared to the existing regression interval. If the new and existing regression intervals are significantly different, the process continues with step 435, otherwise, the existing value of OCV obtained from 300 in FIG. 1 is determined to have sufficient precision and may be used. In one embodiment, the new regression interval may be deemed to be significantly different if the absolute difference (i.e. magnitude of the difference) between the new regression interval start-time and the existing regression interval start-time is more than a pre-determined threshold value and/or the absolute difference between the new regression interval end-time and the existing regression interval end-time is more than another pre-determined threshold value. Some embodiments may have these two thresholds set to the same value; other embodiments may use different values. If the new regression interval is determined to be significantly different from the existing regression interval, then processing proceeds to 435 where the new regression interval is output and made available to other processes in the system, such as 800 in FIG. 1. Next, in 440, the new regression interval end time is compared with the measured collection interval end time, $C_{end}$, as shown in FIG. 3. If the new end time is prior to $C_{end}$, then there are enough measurements already collected to perform regression analysis again in 450 to obtain updated values for OCV and $\tau$. If new end time is after $C_{end}$, then the value of OCV is assessed to be of lower accuracy and discarded.

Referring back to FIG. 1, in one embodiment the regression interval may optionally be adjusted in 800 based on several factors, including but not limited to, the decision to discard OCV in 460 or the operating conditions of the battery. If the regression interval is adjusted, then the new interval is used in 200, 300 and 400. In one embodiment, the new regression interval may be set to the interval obtained from 435. Other embodiments may obtain a new regression interval using different techniques.

Figure 5A:
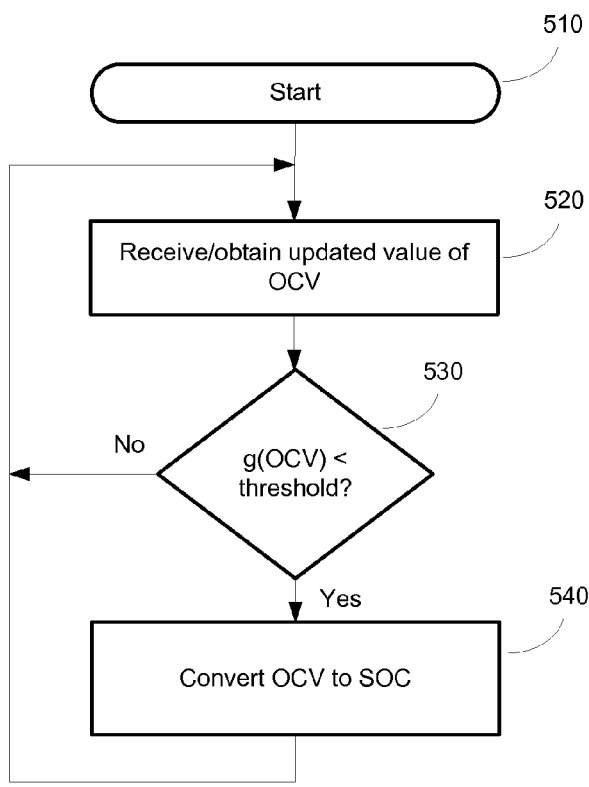
FIG. 5A illustrates an exemplary sequence of operations to convert an OCV value into an SOC value.
Figure 5B:
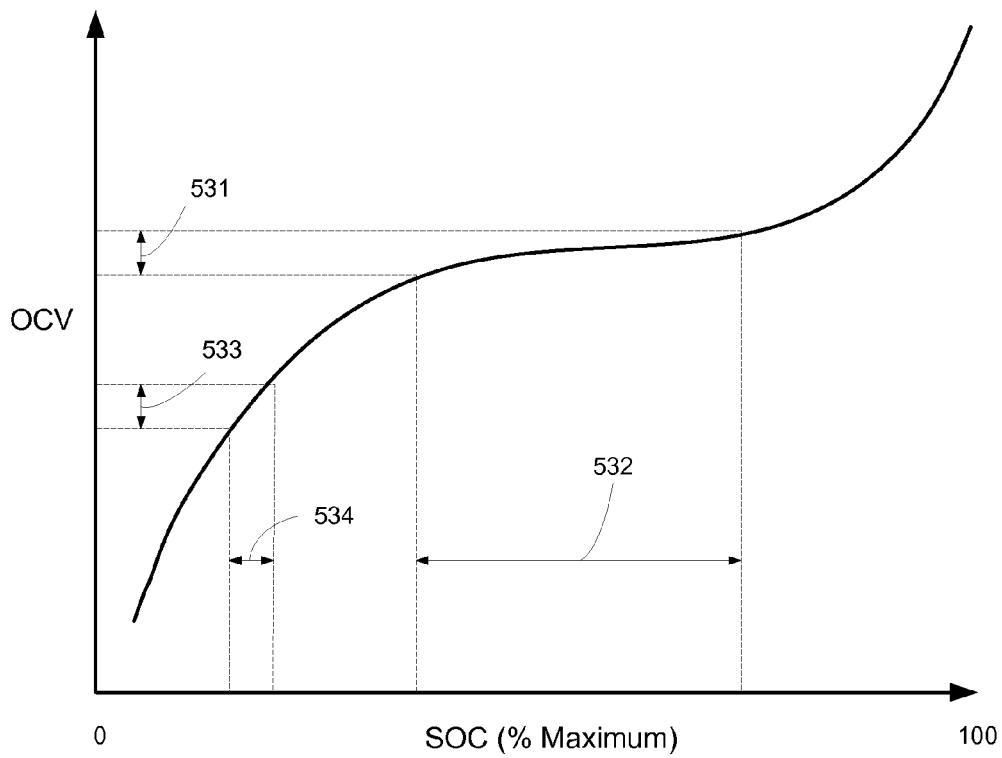
FIG. 5B illustrates an exemplary graph of the relationship between OCV and SOC.

FIG. 5A shows one embodiment of a more detailed view of the process shown in 500 in FIG. 1. When a new value of OCV is obtained in 520, a function g(OCV) in 530 is used to determine the uncertainty of the SOC value that would be predicted from the received OCV. If the uncertainty is greater than a threshold, then the value of OCV is ignored and consequently no new value for SOC is generated. In one embodiment shown in FIG. 5B, g(OCV) uses the slope of the OCV/SOC curve to evaluate the uncertainty of SOC. The function g(OCV) used in 530 in this embodiment is calculated as $\Delta SOC/\Delta OCV$. For example, if a small uncertainty in OCV (531) generates a large uncertainty in SOC (532), then any error in OCV would be greatly exaggerated and the value for SOC corresponding to the OCV value could be incorrect by a significant amount. Conversely, if a small uncertainty in OCV (533) generates a similar small uncertainty in SOC (534), then the value for SOC corresponding to the OCV is more accurate. In one embodiment the value of the threshold used in 530 may be fixed. Other embodiments may use thresholds that change based upon various operational parameters. Continuing with reference to FIG. 5A, if the uncertainty obtained in 530 is less than the threshold, 540 generates a value for SOC from the value of OCV.

Referring again to FIG. 6A battery packs will often have a plurality of cells. To determine the SOC of the battery pack the SOC values for the individual cells must be combined in some manner. In the embodiment shown in FIG. 6A, a plurality of SOC values are determined, one for each battery block, which are then combined to form a SOC value for the battery pack. One embodiment of a technique to combine SOC values from a plurality of battery blocks is to use the following equation:

$$SOC_{pack} = \frac{SOC_{MIN}}{SOC_{MIN} + (1 - SOC_{MAX})}$$

where:
  $SOC_i$=SOC of battery block i
  $SOC_{MIN}$=min($SOC_i$)
  $SOC_{MAX}$=max($SOC_i$)

Other techniques involving different formulas may also be used to obtain a single SOC from a plurality of SOC values obtained from measurements within a battery pack. For example, another embodiment could use the lowest battery block SOC value to represent the overall battery pack SOC.

In many vehicle applications such as electric vehicles, the SOC of the battery may have a direct relationship to the distance the vehicle may travel before it exhausts the energy in the battery and needs to stop to recharge. Uncertainty about the current SOC may cause problems for the driver of the vehicle. For example, an erroneously high estimate of the SOC of the battery may result in the battery running out of energy before the vehicle can return to a charging station, stranding the drivers and passengers. In one embodiment, the uncertainty in the OCV measurement used to determine the SOC is translated into an uncertainty regarding the SOC estimate. This uncertainty is then presented to the driver to assist in estimating the likelihood that the battery energy will be exhausted earlier than expected. One embodiment may present this information to the driver as a warning light, other embodiments may show the uncertainty by having the remaining energy indicator (or "fuel gauge") show a lower value than the SOC estimate.

Figure 7:
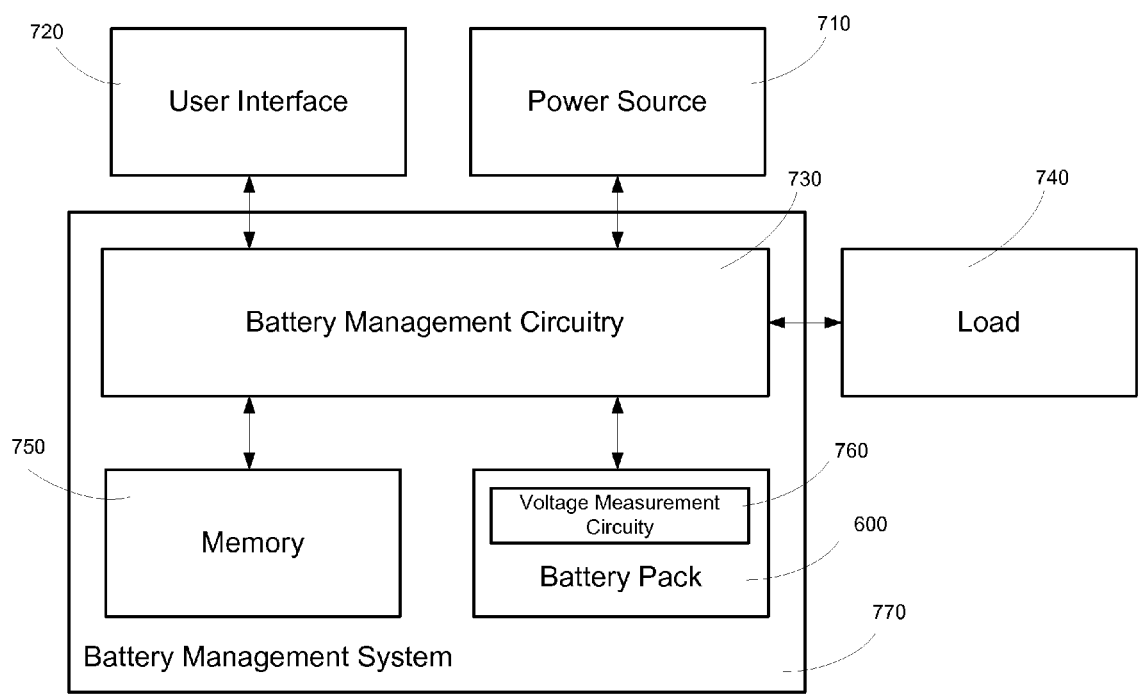
FIG. 7 illustrates an exemplary embodiment of a system for determining the SOC of a battery.

FIG. 7 illustrates an exemplary embodiment of a system for determining the SOC of a battery. The battery management circuitry 730 takes the measurements provided by the voltage measurement circuitry 760 to estimate the SOC and optionally store both the measurements and the SOC in the memory 750 for later use. The battery management circuitry 730 also provides visual indicators of the SOC and/or the uncertainty regarding the SOC estimate to the operator of the system utilizing the user interface 720, in addition to managing the interaction between the power source 710, load 740 and battery pack 600. Examples of types of power sources 710 include, but are not limited to, battery chargers, regenerative braking systems, and alternators on gasoline engines in hybrid vehicles.

The embodiments described herein may be applied to any type of device that can store energy, rechargeable or non-rechargeable, including, but not limited to, alkaline, lithium-ion, nickel-cadmium, lead-acid, flow and atomic batteries, fuel cells, and capacitors.

In the foregoing description and in the accompanying drawings, specific terminology and drawing symbols have been set forth to provide a thorough understanding of the present invention. In some instances, the terminology and symbols may imply specific details that are not required to practice the invention. For example, the term "coupled" is used herein to express a direct connection as well as a connection through one or more intervening circuits or structures. Device or system "programming" may include, for example and without limitation, loading a control value into a register, one-time programmable-circuit (e.g., blowing fuses within a configuration circuit during device production) or other storage circuit within an integrated circuit device of the host system (or host device) and thereby control an operational aspect of the host system or establish a host system configuration. The terms "exemplary" and "embodiment" are used to express an example, not a preference or requirement.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A method of determining a state-of-charge of a battery within a system powered at least in part by the battery comprising:
  collecting a plurality of voltage measurements from the battery during operation of the system;
  deriving a time-constant of relaxation and an open-circuit voltage corresponding to the battery from the voltage measurements and a mathematical model of the battery that relates the voltage measurements to the open-circuit voltage and the time-constant of relaxation; and,
  estimating the state-of-charge of the battery based, at least in part, on the open-circuit voltage;
  wherein the mathematical model comprises a closed mathematical expression that includes the open-circuit voltage and the time-constant of relaxation; and,
  wherein the closed mathematical expression is of the form: $V(t)=OCV-\alpha e^{t/\tau}$, wherein V(t) is one of the voltage measurements at a given point in time, OCV is the open-circuit voltage, $\alpha$ is an overpotential, and $\tau$ is the time-constant of relaxation.

2. The method of claim 1, wherein determining the time-constant of relaxation and the open-circuit voltage comprises regressing the time-constant of relaxation and the open-circuit voltage using the closed expression as a regression function.

3. The method of claim 2, further comprising determining an overpotential value by regressing the overpotential together with the time-constant of relaxation and open-circuit voltage.

4. The method of claim 2, further comprising determining a regression interval based at least in part on the time-constant of relaxation.

5. The method of claim 4, wherein the regression interval is used, at least in part, to estimate the uncertainty of the open-circuit voltage.

6. The method of claim 4, wherein collecting a plurality of voltage measurements comprises collecting the plurality of voltage measurements over a first time interval.

7. The method of claim 6, wherein the first time interval encompasses and has a duration greater than the regression interval.

8. The method of claim 1, wherein a plurality of amperage measurements are also collected during operation of the system.

9. The method of claim 1, wherein a mathematical relationship between the open-circuit voltage and the state-of-charge is used to estimate the uncertainty of the prediction of the state-of-charge from the open-circuit voltage.

10. The method of claim 9, wherein the mathematical relationship comprises a set of measurements relating the open-circuit voltage and the state-of-charge.

11. A method of operation within a system powered at least in part by a battery, the method comprising:
- collecting a plurality of voltage measurements of the battery over a first time interval and during operation of the system, wherein the plurality of voltage measurements are to be used to estimate a state-of-charge of the battery;
- adjusting a time-constant value based on the plurality of voltage measurements collected over the first time interval, the time-constant value indicating a rate at which the battery voltage transitions from a voltage under load to an open-circuit voltage; and
- adjusting the duration of the first time interval based at least in part on the time-constant value;
- wherein adjusting the time-constant value comprises regressing the time-constant value using the function $V(t)=OCV-\alpha e^{t/\tau}$, wherein V(t) is one of the voltage measurements at a given point in time within a regression interval, OCV is the open-circuit voltage, $\alpha$ is an overpotential, and $\tau$ is the time-constant value.

12. The method of claim 11, wherein the first time interval encompasses and has a duration equal or greater than the regression interval.

13. A system powered at least in part by a battery, the system comprising:
- voltage measurement circuitry coupled to the battery to generate a plurality of measurements of the battery voltage during operation of the system;
- battery management circuitry coupled to the voltage measurement circuitry, the battery management circuitry configured to determine a time-constant of relaxation and an open-circuit voltage for the battery from (i) the plurality of measurements of the battery voltage and (ii) a mathematical model of the battery that relates the battery voltage to the open-circuit voltage and the time-constant of relaxation; and
- estimating a state-of-charge of the battery based, at least in part, on the open-circuit voltage;
- wherein the mathematical model comprises a closed mathematical expression that includes the open-circuit voltage and the time-constant of relaxation; and,
- wherein the closed mathematical expression is of the form: $V(t)=OCV-\alpha e^{t/\tau}$, wherein V(t) is one of the voltage measurements at a given point in time, OCV is the open-circuit voltage, $\alpha$ is an overpotential, and $\tau$ is the time-constant of relaxation.

14. The system of claim 13, wherein the battery management circuitry comprises circuitry to determine the time-constant of relaxation and the open-circuit voltage comprising regressing the time-constant of relaxation and the open-circuit voltage using the closed expression as a regression function.

15. The system of claim 14, wherein the battery management circuitry further comprises circuitry to determine a regression interval based at least in part on the time-constant of relaxation.

16. The system of claim 15, wherein the regression interval is used, at least in part, to estimate an uncertainty of the open-circuit voltage.

17. The system of claim 13, wherein the open-circuit voltage is used to estimate an uncertainty of the estimation of the state-of-charge.

18. The system of claim 17, wherein the system contains a user interface that presents visual information about the state-of-charge and the uncertainty of the estimation of the state-of-charge, to an operator of the system.

19. The system of claim 13, wherein the battery is used in an automotive vehicle powered, at least in part, by the battery.

20. The system of claim 13, wherein the battery is comprised of a plurality of battery cells.

* * * * *